United States Patent
Goldfarb et al.

(10) Patent No.: US 6,509,136 B1
(45) Date of Patent: Jan. 21, 2003

(54) PROCESS OF DRYING A CAST POLYMERIC FILM DISPOSED ON A WORKPIECE

(75) Inventors: Dario L. Goldfarb, Putnam Valley, NY (US); Kenneth John McCullough, Fishkill, NY (US); David R. Medeiros, Ossining, NY (US); Wayne M. Moreau, Wappinger, NY (US); John P. Simons, Wappingers Falls, NY (US); Charles J. Taft, Wappingers Falls, NY (US)

(73) Assignee: International Business Machines Corporation, Armonk, CA (US)

( * ) Notice: Subject to any disclaimer, the term of this patent is extended or adjusted under 35 U.S.C. 154(b) by 14 days.

(21) Appl. No.: 09/893,267

(22) Filed: Jun. 27, 2001

(51) Int. Cl.$^7$ .................. G03F 7/027; G03F 7/032; G03F 7/16; B05D 3/00; B29C 71/02
(52) U.S. Cl. ............... 430/272.1; 430/270.1; 430/327; 430/331; 430/935; 427/336; 427/341; 427/352; 427/541
(58) Field of Search ................ 430/327, 935, 430/331, 272.1, 270.1; 427/352, 341, 336, 541

(56) References Cited

U.S. PATENT DOCUMENTS

| | | | |
|---|---|---|---|
| 5,492,793 A | 2/1996 | Breyta et al. | 430/270.14 |
| 5,716,763 A | 2/1998 | Benoit et al. | 430/330 |
| 5,908,510 A | 6/1999 | McCullough et al. | 134/2 |
| 6,001,418 A | 12/1999 | DeSimone et al. | 427/420 |
| 6,043,003 A | 3/2000 | Bucchignano et al. | 430/326 |
| 6,306,564 B1 * | 10/2001 | Mullee | 430/329 |

OTHER PUBLICATIONS

W. Moreau, Semiconductor Lithography, Chap 7, Plenum Press (1988).
Asakawa et al. J. Vac Sci & Tech, B17, 833 (1995).
Kwong et al., SPIE. Proc. 3999, 591 (2000).
J. Kendell et al. Chem Rev., 99, 543 (1999).
Seeger et al., Sol. State Tech, 115, Jun. 1997.
Lercel et al., SPIE Proc., 4066, 105 (2000).

* cited by examiner

Primary Examiner—Richard L. Schilling
(74) Attorney, Agent, or Firm—Scully, Scott, Murphy & Presser; Daniel P. Morris, Esq.

(57) ABSTRACT

A process of drying a cast film polymeric disposed upon a workpiece. In this process a cast polymeric film, which includes a volatile organic compound therein, disposed on a workpiece, is contacted with an extraction agent which may be liquid carbon dioxide or supercritical carbon dioxide.

11 Claims, 1 Drawing Sheet

PROCESS OF DRYING A CAST POLYMERIC FILM DISPOSED ON A WORKPIECE

BACKGROUND OF THE DISCLOSURE

1. Field of the Invention

The present invention is directed to a process of drying a cast polymeric film disposed on a workpiece. More specifically, the present invention is directed to a process of drying a cast polymeric film disposed on a workpiece by contacting the film with liquid or supercritical carbon dioxide.

2. Background of the Prior Art

The casting of polymeric films by such methods as spin coating, spraying, dip coating or roller coating is commonly employed in many commercially important processing operations. A common concern in these processes is the removal of the solvent constituent of the polymeric composition to obtain a polymeric film free of solvent.

A particularly important example of such processing involves the application of polymeric films on semiconductor workpieces in the fabrication of semiconductor devices. The most important of these polymeric films are photoresist compositions, which are disposed on workpieces by spin coating. Commonly, photoresist compositions are disposed on semiconductor wafers. This spin coating step is followed by baking, on a elevated temperature surface such as a hot plate, to drive off the solvent. This standard method of drying cast photoresists films on semiconductor workpieces is discussed in W. Moreau, "Semiconductor Lithography," Chapter 7, Plenum Press, 1988. Unfortunately, hot plate drying of photoresists surfaces removes most of the solvent but, as taught by Ito et al., *J. Photopolymer Sci.*, 1, 625 (1999), up to about 7% by weight of the solvent may remain in the cast photoresist film. This residual solvent, as taught by U.S. Pat. Nos. 5,492,793 6,043,003 and Asakawa et al., *J. Vac. Sci. Technol. B*, 13(3), 833–838 (May./Jun. 1995), adversely affects photoresists, especially chemically amplified photoresists. Moreover, some photoresists, as taught by Kwong et al. *Spie Proc* 3999, 591 (2000), are heat sensitive and decompose at baking temperatures of 100° C. Specifically, photoresists known as "fast" photoresists, which contain acid amplifiers, are particularly susceptible to this problem.

An alternative method of removing solvent contained in photoresists, vacuum drying, although an improvement, does not remove all the solvent in a photoresist composition. The aforementioned Ito et al. reference indicates that up to 4% by weight of the solvent remains in the cast film after even one complete month of vacuum drying. The retention of even 4% solvent in a photoresist film, as those skilled in the art are aware, reduces lithographic resolution of the photoresist film.

Other polymeric films, which are applied in solution, especially those that are sprayed upon surfaces, such as protective coatings including enamels, varnishes, polyurethanes and lacquers, have, in the past, required the presence of organic solvents to reduce their viscosity. These organic solvents are usually volatile organic compounds (VOCs). As such, the adverse environmental impact of such materials have led to increasing governmental regulation of their use. This has resulted in attempts to reduce the use of these VOCs by the development of several alternative compositions. Thus, such alternatives as high solids coating, water-based coatings, powder coatings, non-aqueous dispersions and supercritical carbon dioxide compositions have been developed. None of these alternatives, however, provide the excellent results obtained by spray coating of protective coatings. Thus, the complete elimination of VOCs, consistent with the production of a high performance coating, has, up to the present time, not been obtained.

It is appreciated that the development of supercritical carbon dioxide compositions, as described in U.S. Pat. No. 5,106,650, represent a significant advance in the art. However, many high performance coatings employ amine/epoxy systems. Such systems are not compatible with supercritical carbon dioxide. This is so insofar as conventional amine active sites are highly reactive with carbon dioxide and tend to form amine carbamates that reversibly release carbon dioxide. This reaction causes undesirable results insofar as the resultant film is characterized by the presence of crystals, voids and the like.

It is this result that discourages spin coating of photoresist-liquid carbon dioxide solutions of the type described in U.S. Pat. No. 6,001,418. Therefore, although this positive tone development is a significant advance in the art, it is not employable when positive tone photoresists are utilized. Since most photoresist employed in the manufacture of semiconductor devices are positive photoresists, the invention of the '418 patent is not commercializable.

U.S. Pat. No. 5,716,763 describes a method of baking a photoresist coating onto a semiconductor mask blank which overcomes problems identified in the prior art for performing this task. In this method a semiconductor substrate is immersed in a heated liquid, e.g. a silicone oil, for a time and at a temperature sufficient to obtain a uniform temperature throughout the substrate. Insofar as the heated-liquid is chemically inert with respect to the temperature sensitive photoresist, this teaching has no relationship to the drying of a polymeric film.

The above remarks establishes the need in the art for a new process of drying cast photoresist and other polymeric VOC-containing films. Such a desired process would permit drying of the photoresist or other polymeric film at temperatures far below typical baking temperatures currently employed to remove VOCs.

BRIEF SUMMARY OF THE INVENTION

A new process has been developed for removing volatile organic compounds from photoresist and other polymeric compositions which are cast or sprayed onto a substrate. In this new process environmental problems associated with the removal of VOCs and, concurrently, the removal of residual amounts of these volatile compounds, which produce nonuniform coatings, is provided.

In accordance with the present invention a process is provided for drying photoresists and other polymeric coatings and films that are cast upon workpieces. In this process, the photoresist or other polymeric film, which includes a volatile organic compound therein, disposed upon a workpiece, is contacted with a liquid or supercritical carbon dioxide wherein volatile organic compounds contained therein are extracted therefrom.

In further accordance with the present invention an apparatus for drying a polymeric film composition disposed upon a workpiece is set forth. In that apparatus means for immersing a workpiece, upon which a polymeric film composition is disposed, in liquid or supercritical carbon dioxide is provided.

BRIEF DESCRIPTION OF THE DRAWINGS

The present invention may be better understood by reference to the accompanying drawings of which.

DETAILED DESCRIPTION

Figure 1:
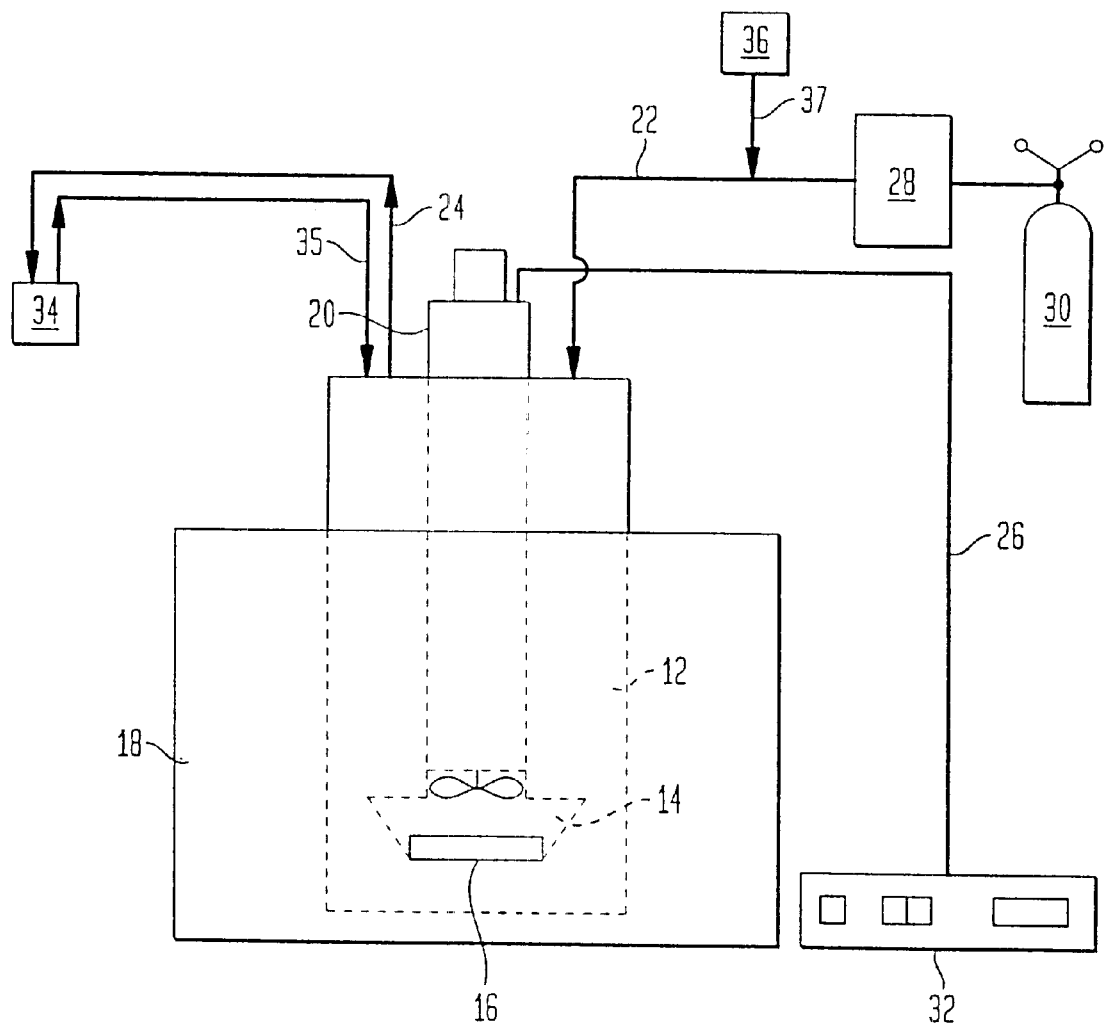
FIG. 1 is a schematic diagram of an apparatus employed in the present invention for drying polymeric films disposed upon a workpiece.

The present invention is directed to a process of drying a polymeric film composition which includes residual amounts of a solvent. Such polymeric film compositions usually result from the casting of a polymeric material upon a workpiece although the invention is not limited to any particular method defining the manner upon which the polymeric film is cast upon a workpiece. In this process the polymeric film composition, disposed upon a workpiece, is placed in a controlled chamber which is maintained at a pressure of at least about 100 pounds per square inch (psi) and a temperature of at least about −53° C. Preferably, the thermodynamic conditions in the controlled chamber are maintained at a pressure in the range of between about 100 psi and about 10,000 psi and a temperature in he range of between about −53° C. and about 70° C. More preferably, the thermodynamic conditions in the chamber are maintained at a pressure in the range of between about 200 psi and about 5,000 psi and a temperature in the range of between about −20° C. and about 50° C.

In the chamber, the polymeric film composition is contacted with an extracting effective amount of an extraction agent selected from the group consisting of liquid carbon dioxide and supercritical carbon dioxide. The liquid or supercritical carbon dioxide extraction agent is provided neat or in a composition which includes up to 10% by weight, based on the total weight of the composition, of an inert solvent.

In the preferred embodiment wherein a composition is provided the inert solvent is preferably an inert hydrocarbon. In the event that the hydrocarbon is aliphatic, it is preferred that the hydrocarbon be a linear or cyclic alkane. A particularly preferred aliphatic hydrocarbon, useful as the solvent is cyclohexane. A particularly preferred aromatic hydrocarbon is xylene.

The aforementioned process is practiced in an apparatus the specific arrangement of which is depicted in FIG. 1. Therein, it is seen that a process chamber in which drying occurs is denoted at 12. A workpiece upon which a polymeric film is disposed, is depicted in FIG. 1 by reference numeral 16. The workpiece 16 is specifically located in sample zone 14 of chamber 12. The process chamber 12 is surrounded by a heater jacket 18 and may include a stirring mechanism 20. Additionally, the process chamber 12 includes an inlet line 22, an outduct 24 and a thermocouple 26. The inlet line 22 contains a high pressure pumping system 28 which is in communication with a cylinder 30 for supplying supercritical carbon dioxide to the process chamber 12. Thermocouple 26 is in communication with a heater controller 32 which is utilized for controlling and monitoring the temperature in the process chamber 12. The apparatus for conducting the process of the present invention may also include a reservoir 34 for collecting and/or purifying supercritical carbon dioxide that exits process chamber 12 through outduct 24. This material may then be recycled into process chamber 12 through duct 35.

In the contact between the extraction agent and the polymeric film, disposed on a workpiece, it is preferred, but not essential, that the workpiece be disposed upon a turntable or other rotating device to ensure that the extraction agent is distributed uniformly over the polymeric film. This embodiment provides the advantage of permitting polymeric film casting and solvent extraction to occur in the same apparatus. As those skilled in the art are aware, casting of polymeric films, such as photoresists, typically occur by casting the polymeric composition on a rotating workpiece, such as by being disposed on a turntable.

As stated above, the polymeric film is provided on a workpiece. The workpiece may be a silicon wafer, a circuit board, a chrome mask blank, a membrane mask or the like. Preferably, the workpiece is a silicon wafer. The polymeric film composition is any polymeric film which is formed from a solution of a polymer and a solvent. In a preferred embodiment the polymeric film is a photoresist material. More preferably, the photoresist polymer is a positive photoresist, such as a diazoquione/novolak, a polychloroacrylate/methylstyrene material or the like, which is commonly employed in processing of semiconductor materials.

The following examples are given to illustrate the scope of the present invention. Because these examples are given for illustrative purposes only, the invention should not be deemed limited thereto.

EXAMPLE 1

A first photoresist composition was spun cast upon a silicon wafer. The first photoresist composition was KRS®, a ketal-protected polyhydroxystyrene chemically amplified photoresist described in U.S. Pat. No. 6,043,003, which is incorporated herein by reference. A second photoresist was also spun cast upon a silicon wafer. The second photoresist was ZEP®, a commercial electron beam photoresist manufactured by Nippon Zeon. This photoresist is based on polychloroacrylate and poly-α-methylstyrene. In addition, a third spin cast film, not a photoresist, SiLK®, a poly (ethynylbenzene), manufactured by Dow Corning, was similarly disposed upon a silicon wafer. SiLK® is a dielectric insulating material usually disposed between a substrate and a photoresist layer in the formation of semiconductor devices.

Three identical samples of each of these three spin cast films on silicon wafers were prepared. One of each of the three devices was processed in accordance with the prior art method of heating the cast film on a hot plate at a temperature of about 100° C. to remove volatile organic solvents. Two samples of each of the three film-coated silicon wafers were processed in accordance with the present invention. In a first processing scheme, in accordance with the present invention, the samples were contacted with supercritical carbon dioxide at a temperature of 32° C. and at a pressure of 2,000 psi. In a second processing procedure, also in accordance with the present invention, the supercritical carbon dioxide was applied at a temperature of 70° C. and a pressure of 5,000 psi.

The films of the nine thus processed workpieces were then measured to determine their thicknesses. This measurement provides a determination of the degree of solvent removal. The thinner the film thickness, the greater the degree of solvent removal. However, it is emphasized, that in the case of the dielectric insulating material, SiLK®, the product was thereupon cured at 300° C. in accordance with usual dielectric insulating layer formation practice. Thus, the dielectric layer film thickness does not conclusively establish the degree of solvent removal.

A second test was conducted which is determinative of solvent concentration reduction in photoresist films. That test is a measure of refractive index. The refractive index of the films of the nine samples were measured at 248 nm.

Those skilled in the art are aware that the greater the solvent concentration, the lower is the refractive index insofar as organic solvents have lower refractive indeces than does photoresist polymers. Again, this principle does not apply to the refractive index of SiLK® which, as stated above, is subsequently cured at 300° C. driving off any residual organic solvent.

Finally, in a third test, the aforementioned samples were tested to determine the absorptivity of the films at 248 nm. Photoresists having low absorptivity are preferred since low absorptivity is consistent with good lithographic performance.

The results of the test are summarized in the Table.

TABLE

| Polymeric Film | Solvent Removal | Film Thickness, Å | Refractive Index @ 248 nm | Absorptivity @ 248 nm |
|---|---|---|---|---|
| KRS ® Photoresist | Hot Plate | 8639 | 1.805 | 0.009 |
| KRS ® Photoresist | 2000 psi @ 32° C. | 8520 | 1.835 | 0.019 |
| KRS ® Photoresist | 5000 psi @ 70° C. | 7615 | 1.814 | 0.010 |
| ZEP ® Photoresist | Hot Plate | 2012 | 1.710 | 0.002 |
| ZEP ® Photoresist | 2000 psi @ 32° C. | 1993 | 1.714 | 0.002 |
| ZEP ® Photoresist | 5000 psi @ 70° C. | 1880 | 1.832 | 0.006 |
| SiLK ® Dielectric | Hot Plate | 5441 | 1.871 | 0.171 |
| SiLK ® Dielectric | 2000 psi @ 32° C. | 5439 | 1.863 | 0.179 |
| SiLK ® Dielectric | 5000 psi @ 70° C. | 5525 | 1.844 | 0.173 |

Discussion of Results of Example 1

The film thickness and refractory index data of the photoresist films establish that the degree of solvent removal was greater when supercritical carbon dioxide was employed as the extraction agent compared to solvent removal by the prior art process of heating the cast films on a hot plate at temperatures as high as 100° C. Thus, improved photoresist characteristics are obtained after processing of the photoresist layer in accordance with the present invention.

The absorptivity of the photoresist films data in all three solvent removal processes was substantially of the same order of magnitude. As such, this data establishes that the process of the present invention does not have any adverse effect upon the chemical characteristics of the photoresist layer compared to the processes employed in the prior art.

Turning to the data directed to the dielectric film, that data establishes substantial identity in the characteristics of films formed in accordance with the prior art method and the method of the present invention.

In all cases, then, the present invention represents a significant advance in the art insofar as the environmental improvement of avoiding venting of harmful volatile organic solvents into the atmosphere is provided without any detrimental effect upon the physical properties of the cast photoresist or other polymeric films. Furthermore, in view of the very high cost of the ultra pure solvents employed in semiconductor fabrication, the recovery of solvent, obtainable in the present invention, involves a considerable economic advantage of the process of the present invention over the processes of the prior art.

EXAMPLE 2

The KRS® photoresist film of Example 1 in which solvent extraction took place at 2000 psi and 32° C. was cured by exposure to ultraviolet light and then developed in an alkaline solution.

This successful processing of the KRS® further emphasizes the benefits of the solvent extraction process of the present invention. That is, the successful curing of the KRS® photoresist film is indicative of the absence of any loss of photoacid generator, an essential ingredient in the curing of the photoresist film.

The above embodiments and examples are provided to illustrate the scope and spirit of the present invention. These embodiments and examples will make apparent, to those skilled in the art, other embodiments and examples. Those other embodiments and examples are within the contemplation of the present invention. Therefore, the present invention could be limited by the appended claims.

What is claimed is:

1. A process of drying a cast polymeric film comprising contacting a polymeric film, which includes a volatile organic compound therein, disposed upon a workpiece, with an extraction agent selected from the group consisting of liquid carbon dioxide and supercritical carbon dioxide.

2. A process in accordance with claim 1 wherein said polymeric film is photoresist film.

3. A process in accordance with claim 2 wherein said workpiece is a silicon wafer.

4. A process in accordance with claim 1 wherein said workpiece is a silicon wafer.

5. A process in accordance with claim 1 wherein said polymeric film is contacted with said extraction agent at a pressure in the range of between about 100 psi and about 10,000 psi and a temperature in the range of between about −53° C. and about 70° C.

6. A process in accordance with claim 5 wherein said pressure is in the range of between about 200 psi and about 5,000 psi and said temperature is in the range of between about −20° C. and about 50° C.

7. A process in accordance with claim 1 wherein said extraction agent is selected from the group consisting of a liquid carbon dioxide composition and a supercritical carbon dioxide composition.

8. A process in accordance with claim 7 wherein said liquid carbon dioxide composition or said supercritical carbon dioxide composition includes an inert solvent.

9. A process in accordance with claim 8 wherein said inert solvent is present in a concentration of up to about 10% by weight, based on the total weight of said composition.

10. A process in accordance with claim 8 wherein said inert solvent is an inert hydrocarbon.

11. A process in accordance with claim 10 wherein said hydrocarbon is selected from the group consisting of cyclohexane and xylene.

* * * * *

UNITED STATES PATENT AND TRADEMARK OFFICE
CERTIFICATE OF CORRECTION

PATENT NO. : 6,509,136 B1
DATED : January 21, 2003
INVENTOR(S) : Dario L. Goldfarb et al.

It is certified that error appears in the above-identified patent and that said Letters Patent is hereby corrected as shown below:

<u>Title page,</u>
Item [73], "Armonk, CA" should read -- Armonk, NY --

Signed and Sealed this

Twenty-fourth Day of February, 2004

JON W. DUDAS
*Acting Director of the United States Patent and Trademark Office*